United States Patent
Guo et al.

(10) Patent No.: US 12,206,049 B2
(45) Date of Patent: Jan. 21, 2025

(54) INORGANIC LIGHT-EMITTING DIODE SUBSTRATE AND MANUFACTURING METHOD THEREOF, AND INORGANIC LIGHT-EMITTING DIODE DISPLAY DEVICE

(71) Applicant: BOE TECHNOLOGY GROUP CO., LTD., Beijing (CN)

(72) Inventors: Wei Guo, Beijing (CN); Hu Meng, Beijing (CN); Qi Qi, Beijing (CN)

(73) Assignee: BOE TECHNOLOGY GROUP CO., LTD. (CN)

( * ) Notice: Subject to any disclaimer, the term of this patent is extended or adjusted under 35 U.S.C. 154(b) by 404 days.

(21) Appl. No.: 17/620,423

(22) PCT Filed: Jan. 6, 2021

(86) PCT No.: PCT/CN2021/070511
§ 371 (c)(1),
(2) Date: Dec. 17, 2021

(87) PCT Pub. No.: WO2021/196817
PCT Pub. Date: Oct. 7, 2021

(65) Prior Publication Data
US 2022/0359789 A1    Nov. 10, 2022

(30) Foreign Application Priority Data

Apr. 3, 2020 (CN) .......................... 202010262697.5

(51) Int. Cl.
*H01L 33/38* (2010.01)
*H01L 33/00* (2010.01)

(52) U.S. Cl.
CPC .......... *H01L 33/382* (2013.01); *H01L 33/005* (2013.01); *H01L 2933/0016* (2013.01)

(58) Field of Classification Search
CPC ................. H01L 33/382; H01L 33/005; H01L 2933/0016; H01L 25/0753;
(Continued)

(56) References Cited

U.S. PATENT DOCUMENTS 9,368,683 B1 * 6/2016 Meitl ...................... H01L 33/36
2007/0290613 A1   12/2007 Choi et al.
(Continued)

FOREIGN PATENT DOCUMENTS

CN    109585488         4/2019
CN    109585488  A  *  4/2019
(Continued)

OTHER PUBLICATIONS

PCT International Search Report (w/ English translation) for corresponding PCT Application No. PCT/CN2021/070511, mailed Apr. 8, 2021, 6 pages.
(Continued)

*Primary Examiner* — S M Sohel Imtiaz
(74) *Attorney, Agent, or Firm* — Dority & Manning, P.A.

(57) ABSTRACT

An inorganic light-emitting diode substrate includes: a base, a plurality of epitaxial layer structures disposed on the base, a passivation layer, and a plurality of second electrodes disposed on a side of the passivation layer away from the base. The base includes a base substrate and a plurality of first electrodes disposed on the base substrate. The plurality of epitaxial layer structures are spaced apart, and each first electrode is coupled to one epitaxial layer structure. The passivation layer is made of photoresist. The passivation layer covers surfaces, away from the base, of the plurality of epitaxial layer structures, and fills gaps between the plurality of epitaxial layer structures. The passivation layer has a plurality of via holes, and each second electrode is coupled to one epitaxial layer structure through at least one via hole.

17 Claims, 7 Drawing Sheets

(58) Field of Classification Search
CPC ............. H01L 2933/0025; H01L 33/44; H01L 27/156; H01L 24/97; H01L 27/124; H01L 33/36; H01L 2924/12041; G09F 9/33
See application file for complete search history.

(56) References Cited

U.S. PATENT DOCUMENTS

| | | | |
|---|---|---|---|
| 2012/0274617 A1* | 11/2012 | Fukuda | H10K 50/852 |
| | | | 313/504 |
| 2012/0313133 A1* | 12/2012 | Chen | H01L 25/167 |
| | | | 257/E33.056 |
| 2015/0108525 A1* | 4/2015 | Chae | H01L 33/405 |
| | | | 257/98 |
| 2016/0351548 A1* | 12/2016 | Chen | H01L 25/0753 |
| 2018/0083083 A1* | 3/2018 | Kim | H10K 50/844 |
| 2018/0254383 A1* | 9/2018 | Perzlmaier | H01L 33/505 |
| 2019/0035773 A1 | 1/2019 | Lo et al. | |
| 2019/0326330 A1* | 10/2019 | Xia | H01L 25/0753 |
| 2020/0050058 A1* | 2/2020 | Kuo | G09G 3/32 |
| 2020/0402964 A1* | 12/2020 | Kim | H01L 25/0756 |
| 2021/0020818 A1* | 1/2021 | Choi | H01L 27/156 |
| 2023/0015395 A1* | 1/2023 | Lee | H01L 25/0753 |

FOREIGN PATENT DOCUMENTS

| | | |
|---|---|---|
| CN | 110491986 | 11/2019 |
| JP | 2011100975 A | 5/2011 |
| JP | 2012142489 A | 7/2012 |
| JP | 2013037138 A | 2/2013 |
| JP | 2013171841 A | 9/2013 |
| JP | 2015026731 A | 2/2015 |
| JP | 2018078279 A | 5/2018 |
| JP | 2019507905 A | 3/2019 |
| WO | WO2018047770 A1 | 3/2018 |
| WO | WO2019168187 A1 | 9/2019 |

OTHER PUBLICATIONS

Japanese Office Action (w/ English translation) for corresponding JP Application No. 2022-540504, dated Jul. 23, 2024, 12 pages.
Japanese Office Action (w/ English translation) for corresponding JP Application No. 2022-540504, dated Nov. 5, 2024, 8 pages.

* cited by examiner

INORGANIC LIGHT-EMITTING DIODE SUBSTRATE AND MANUFACTURING METHOD THEREOF, AND INORGANIC LIGHT-EMITTING DIODE DISPLAY DEVICE

CROSS-REFERENCE TO RELATED APPLICATIONS

This application is a national phase entry under 35 USC 371 of International Patent Application No. PCT/CN2021/070511, filed on Jan. 6, 2021, which claims priority to Chinese Patent Application No. 202010262697.5, filed on Apr. 3, 2020, which are incorporated herein by reference in their entirety.

TECHNICAL FIELD

The present disclosure relates to the field of display technologies, and in particular, to an inorganic light-emitting diode substrate and a manufacturing method thereof, and an inorganic light-emitting diode display device.

BACKGROUND

In the field of display technologies, a micro light-emitting diode (micro LED) display technology is a miniaturization and matrix technology of light-emitting diodes. Micro LED display devices have advantages of high resolution, low power consumption, high brightness, high definition, high color saturation, fast response speed, long service life, etc., and have good application prospects.

SUMMARY

In an aspect, an inorganic light-emitting diode substrate is provided, including: a base, a plurality of epitaxial layer structures, a passivation layer, and a plurality of second electrodes. The base includes a base substrate and a plurality of first electrodes disposed on the base substrate. The plurality of epitaxial layer structures are disposed on the base, and the plurality of epitaxial layer structures are spaced apart. Each first electrode is coupled to one epitaxial layer structure. The passivation layer is made of photoresist, the passivation layer covers surfaces, away from the base, of the plurality of epitaxial layer structures, and fills gaps between the plurality of epitaxial layer structures, and the passivation layer has a plurality of via holes. The plurality of second electrodes are disposed on a side of the passivation layer away from the base, and each second electrode is coupled to one epitaxial layer structure through at least one via hole.

In some embodiments, the passivation layer includes first portions and a second portion. The first portions cover surfaces, away from the base, of the plurality of epitaxial layer structures, and the second portion fills the gaps between the plurality of epitaxial layer structures. Relative to a surface, on which the plurality of first electrodes are disposed, of the base substrate, surfaces of the first portions away from the base are flush with a surface of the second portion away from the base.

In some embodiments, a ratio of a thickness of the first portions of the passivation layer to a thickness of the epitaxial layer structures is in a range of 1:1 to 3:1.

In some embodiments, the passivation layer is made of epoxy-based photoresist.

In some embodiments, each epitaxial layer structure includes: a first semiconductor layer, a light-emitting layer, and a second semiconductor layer that are stacked. The light-emitting layer is located between the first semiconductor layer and the second semiconductor layer. In the epitaxial layer structure, the first semiconductor layer is closer to the base than the light-emitting layer and the second semiconductor layer. Each first electrode is coupled to the first semiconductor layer in one epitaxial layer structure, and each second electrode is coupled to the second semiconductor layer in one epitaxial layer structure through at least one via hole.

In some embodiments, the base includes: the base substrate, driving circuits, and the plurality of first electrodes. The driving circuits are disposed on the base substrate, the plurality of first electrodes are disposed on a side of the driving circuits away from the base substrate, and the first electrode is coupled to one driving circuit.

In another aspect, a manufacturing method of an inorganic light-emitting diode substrate is provided, including: providing a base and a plurality of epitaxial layer structures, and the base including a plurality of first electrodes; transferring the plurality of epitaxial layer structures onto the base, so that each epitaxial layer structure is coupled to one first electrode; forming a photoresist film on the base on which the plurality of epitaxial layer structures have been formed, so that the photoresist film covers surfaces, away from the base, of the plurality of epitaxial layer structures, and fills gaps between the plurality of epitaxial layer structures; patterning the photoresist film to form a plurality of via holes in the photoresist film, so as to obtain a passivation layer; and forming a plurality of second electrodes on a surface of the passivation layer away from the base, and each second electrode being coupled to one epitaxial layer structure through at least one via hole.

In some embodiments, patterning the photoresist film to form the plurality of via holes in the photoresist film, so as to obtain the passivation layer includes: providing a mask on a side of the photoresist film away from the base; performing exposure and development processes on the photoresist film to form the plurality of via holes in the photoresist film; and curing the photoresist film in which the plurality of via holes have been formed to obtain the passivation layer.

In some embodiments, forming the photoresist film on the base on which the plurality of epitaxial layer structures have been formed includes: spin-coating photoresist on the base on which the plurality of epitaxial layer structures have been formed, so that the photoresist covers the surfaces, away from the base, of the plurality of epitaxial layer structures, and fills the gaps between the plurality of epitaxial layer structures; and pre-curing the photoresist to form the photoresist film.

In some embodiments, before forming the plurality of first electrodes on the surface of the passivation layer away from the base, the manufacturing method of the inorganic light-emitting diode substrate further includes: performing a residue removal processing on the plurality of via holes by using a plasma process, so as to remove residues remaining in the plurality of via holes after the photoresist film is developed.

In yet another aspect, an inorganic light-emitting diode display device is provided, including: the inorganic light-emitting diode substrate as described above, and an encapsulation substrate disposed on a side of the inorganic light-emitting diode substrate.

In some embodiments, the thickness of the first portions is in a range of 1 μm to 3 μm.

In some embodiments, a thickness of the second portion is in a range of 2 μm to 4 μm.

In some embodiments, the first semiconductor layer is made of N-type gallium nitride, and the second semiconductor layer is made of P-type gallium nitride.

In some embodiments, the first semiconductor layer is made of P-type gallium nitride, and the second semiconductor layer is made of N-type gallium nitride.

In some embodiments, the plurality of first electrodes are arranged in an array, and the plurality of second electrodes are coupled to each other to form a cathode layer.

In some embodiments, the plurality of epitaxial layer structures are arranged in an array.

In some embodiments, a gap between adjacent epitaxial layer structures is in a magnitude of microns.

In some embodiments, the plurality of first electrodes are arranged in an array, and first electrodes in a same row are coupled to each other to form a first electrode strip; the plurality of second electrodes are arranged in an array, and second electrodes in a same column are coupled to each other to form a second electrode strip; and the plurality of epitaxial layer structures are arranged in an array, and a region where the first electrode strip and the second electrode strip are overlapped is provided with one epitaxial layer structure.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on actual sizes of products, actual processes of methods and actual timings of signals involved in the embodiments of the present disclosure.

DETAILED DESCRIPTION

Technical solutions in some embodiments of the present disclosure will be described clearly and completely below with reference to the accompanying drawings. Obviously, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "included, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, the terms "first" and "second" are used for descriptive purposes only, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of", "the plurality of" or "multiple" means two or more unless otherwise specified.

In the description of some embodiments, the terms such as "coupled" and "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

Exemplary embodiments are described herein with reference to sectional views and/or plan views as idealized exemplary accompanying drawings. In the accompanying drawings, thicknesses of layers and sizes of regions are enlarged for clarity. Variations in shapes with respect to the drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

A micro light-emitting diode display device includes a base and a plurality of micro epitaxial layer structures disposed on the base. The plurality of micro epitaxial layer structures are arranged in an array, and a gap between adjacent micro epitaxial layer structures may be in a magnitude of microns, so as to achieve high resolution display.

In a process of manufacturing the micro light-emitting diode display device, the plurality of epitaxial layer structures are transferred onto the base, so that the plurality of epitaxial layer structures are coupled to anodes in the base; after that, a passivation film is fabricated to make the plurality of epitaxial layer structures be insulated from each other; subsequently, via holes are formed in the passivation film, so as to obtain a passivation layer; and then, cathodes are formed on the passivation layer, so that the cathodes are coupled to the epitaxial layer structures through the via holes in the passivation layer.

Figure 1:
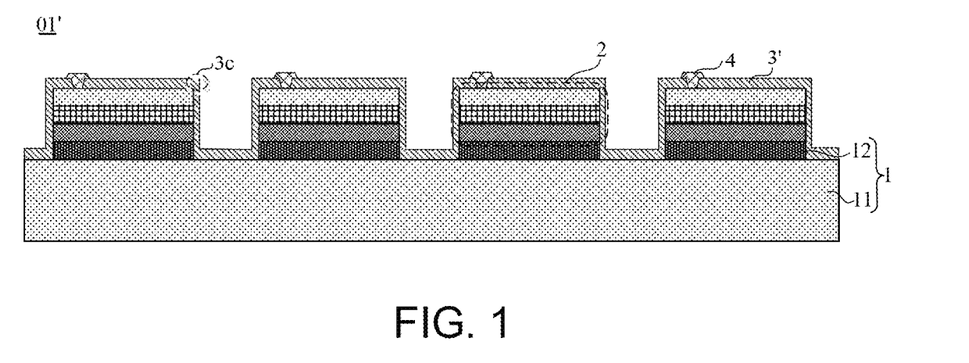
FIG. 1 is a diagram showing a structure of an inorganic light-emitting diode substrate, in accordance with some embodiments of the related art.

In the related art, an inorganic material such as silicon dioxide is used for forming the passivation layer. As shown in FIG. 1, in an inorganic light-emitting diode substrate 01', the passivation layer 3' is usually fabricated by using a deposition process. In this way, a thickness of the passivation layer 3' is relatively uniform, and portions of the passivation layer 3' that cover the epitaxial layer structures 2 are protrudent relative to a portion of the passivation layer 3' that is located in gaps between the plurality of epitaxial layer structures 2. In a case where the thickness of the passivation layer 3' is relatively small, the passivation layer is prone to crack at corners (referring to the circled part 3c in FIG. 1) of surfaces of the epitaxial layer structures 2 away from the base 1, which causes electrical leakage. If the thickness of the passivation layer 3' is increased, a stress of the inorganic material such as the silicon dioxide is relatively large, so that the passivation layer may be detached, which will also cause electrical leakage.

Moreover, the passivation layer is made of the silicon dioxide, and the formation of the via holes in the passivation layer requires use of deposition and etching processes. For example, a silicon dioxide film is deposited first, then a barrier layer with via hole patterns is formed on the silicon dioxide film, and then the silicon dioxide film is etched, so that the via holes are formed. As a result, fabrication steps are complicated, and a plasma enhanced chemical vapor deposition (PECVD) equipment and a reactive ion etching (RIE) equipment or an inductively coupled plasma (ICP) etching equipment are required, resulting in high manufacturing costs.

Some embodiments of the present disclosure provide an inorganic light-emitting diode substrate 01, as shown in FIGS. 2A to 4, and 11, the inorganic light-emitting diode substrate 01 includes: a base 1, a plurality of epitaxial layer structures 2, a passivation layer 3, and a plurality of second electrodes 4.

The base 1 includes a base substrate 11 and a plurality of first electrodes 12 disposed on the base substrate 11. The plurality of epitaxial layer structures 2 are disposed on the base 1, and the plurality of epitaxial layer structures 2 are spaced apart. Each first electrode 12 is coupled to one epitaxial layer structure 2.

The passivation layer 3 is made of photoresist. The passivation layer 3 covers surfaces, away from the base 1, of the plurality of epitaxial layer structures 2, and fills gaps between the plurality of epitaxial layer structures 2. For example, the gaps include a gap between any two adjacent epitaxial layer structures 2 and a gap between any four adjacent epitaxial layer structures 2. As shown in FIG. 2B, the passivation layer 3 is provided with a plurality of via holes 3v therein.

The plurality of second electrodes 4 are disposed on a side of the passivation layer 3 away from the base 1, and each second electrode 4 is coupled to one epitaxial layer structure through at least one via hole 3v. As shown in FIG. 2B, each second electrode 4 is coupled to the epitaxial layer structure 2 through one via hole 3v.

For example, the first electrode 12 is one of an anode and a cathode, and the second electrode 4 is the other of the anode and the cathode. The first electrode 12 and the second electrode 4 are configured to provide voltages to the epitaxial layer structure 2, so that the epitaxial layer structure 2 is driven by the voltages to emit light.

In the inorganic light-emitting diode substrate 01 provided in the embodiments of the present disclosure, the photoresist is used for forming the passivation layer 3. Since the photoresist has a fluidity, the photoresist may fill the gap between any two or more adjacent epitaxial layer structures 2 during a coating process in a fabrication process of the passivation layer 3. Therefore, the formed passivation layer 3 may cover the surfaces, away from the base 1, of the plurality of epitaxial layer structures 2, and fill the gaps between the plurality of epitaxial layer structures 2; and a surface, away from the base 1, of the passivation layer 3 is relatively flat. In this way, it may avoid the problem that the passivation layer 3 is prone to crack at the corners of the surfaces of the epitaxial layer structures 2 away from the base 1, and eliminate the electrical leakage caused by the crack of the passivation layer 3.

In addition, since the photoresist is an organic material, and an adhesive force of the photoresist is better than an adhesive force of the inorganic material such as the silicon dioxide, there is no detaching problem of the passivation layer 3.

A film made of the photoresist is exposed and developed to form the plurality of via holes 3v in the photoresist film, so that the passivation layer 3 is obtained. Since exposure and development processes are relatively simple, a equipment cost involved is relatively low. Therefore, the embodiments of the present disclosure do not need to adopt the deposition and etching processes used in the fabrication of the passivation layer 3' with the silicon dioxide in the related art, which avoids the use of high-cost deposition and etching equipments, simplifies a fabrication process, and saves a fabrication cost.

Furthermore, a light extraction efficiency of the epitaxial layer structure 2 is related to a refractive index of the passivation layer 3. At a critical surface between the epitaxial layer structure 2 and the passivation layer 3, total reflection occurs when an incident angle of light emitted by the epitaxial layer structure 2 is greater than a critical angle of the total reflection, and the light will be reflected back into the epitaxial layer structure 2 and cannot exit. Therefore, the larger the critical angle of the total reflection is, the larger an amount of exiting light is, and the higher the light extraction efficiency of the epitaxial layer structure 2 is. According to a calculation formula of the critical angle θ of the total reflection, i.e., sin θ=$n_2$/$n_1$, where $n_2$ is a refractive index of an optically rarer medium (here is the refractive index of the passivation layer 3), and $n_1$ is a refractive index of an optically denser medium (here is a refractive index of a layer that is in contact with the passivation layer 3 in the epitaxial layer structure 2), it can be seen that based on a certain $n_1$, the larger $n_2$ is, the larger the critical angle θ of the total reflection is. In a case where the passivation layer is made of a photoresist with a high refractive index (being greater than a refractive index of silicon dioxide), such as epoxy-based photoresist, a critical angle of the total reflection corresponding to the passivation layer 3 made of the photoresist in the embodiments of the present disclosure is greater than a critical angle of the total reflection corresponding to the passivation layer made of the silicon dioxide. Thus, in the inorganic light-emitting diode substrate 01 provided in the embodiments of the present disclosure, more of the light emitted by the epitaxial layer structure 2 may pass through the passivation layer 3 and then exit, which is beneficial to improving the light extraction efficiency of the epitaxial layer structure 2, and further improve a luminous efficiency of the inorganic light-emitting diode substrate 01.

Figure 2A:
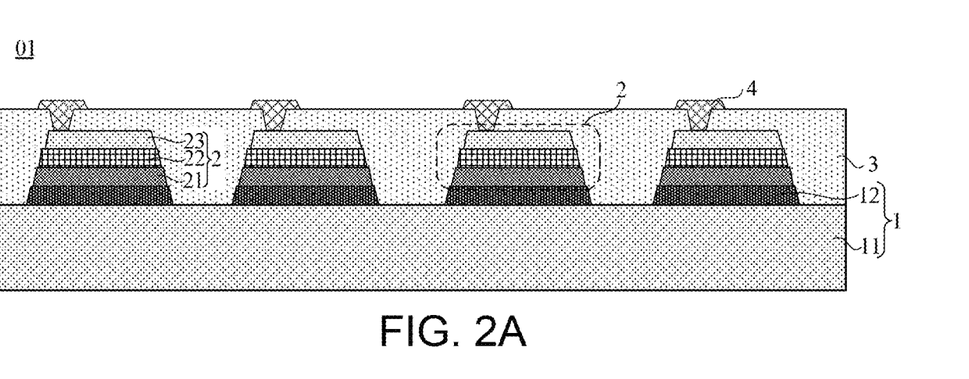
FIG. 2A is a diagram showing a structure of an inorganic light-emitting diode substrate, in accordance with some embodiments of the present disclosure.
Figure 2B:
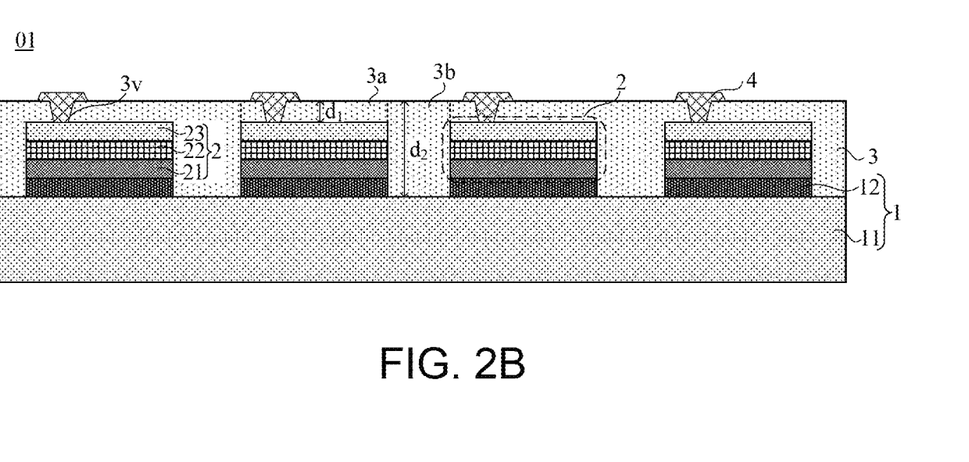
FIG. 2B is a diagram showing a structure of another inorganic light-emitting diode substrate, in accordance with some embodiments of the present disclosure.

It will be noted that, in the inorganic light-emitting diode substrate 01 shown in FIG. 2A, due to process factors, sidewalls of each layer of the epitaxial layer structure may be at a certain angle relative to a surface, on which the first electrodes 12 are arranged, of the base substrate 11. For example, a shape of a section, perpendicular to the surface of the base substrate 11, of each layer of the epitaxial layer structure is trapezoidal. For example, a method for fabricating the plurality of epitaxial layer structures 2 in the inorganic light-emitting diode substrate 01 includes: sequentially growing entire films for forming the epitaxial layer structures on a silicon base; inverting the entire films for forming the epitaxial layer structures together with the silicon base onto the base 1; removing the silicon base; and then patterning the entire films remaining on the base 1 by using an etching process to obtain the epitaxial layer structures 2. During the etching process, an area of an etched portion of a film away from the base 1 is greater than an area of an etched portion of a film proximate to the base 1. In this way, in the finally formed epitaxial layer structure, an area of a layer away from the base 1 is less than an area of a layer proximate to the base 1, so that the shape of the section, perpendicular to the surface of the base substrate 11, of each layer of the epitaxial layer structure 2 is trapezoidal.

For convenience of description, as shown in FIGS. 2B to 4, the sidewalls of each layer of the epitaxial layer structure 2 in the inorganic light-emitting diode substrate 01 are shown to be perpendicular to the base substrate 11, but this does not limit a structure of the inorganic light-emitting diode substrate 01 provided in the embodiments of the present disclosure.

Figure 5:
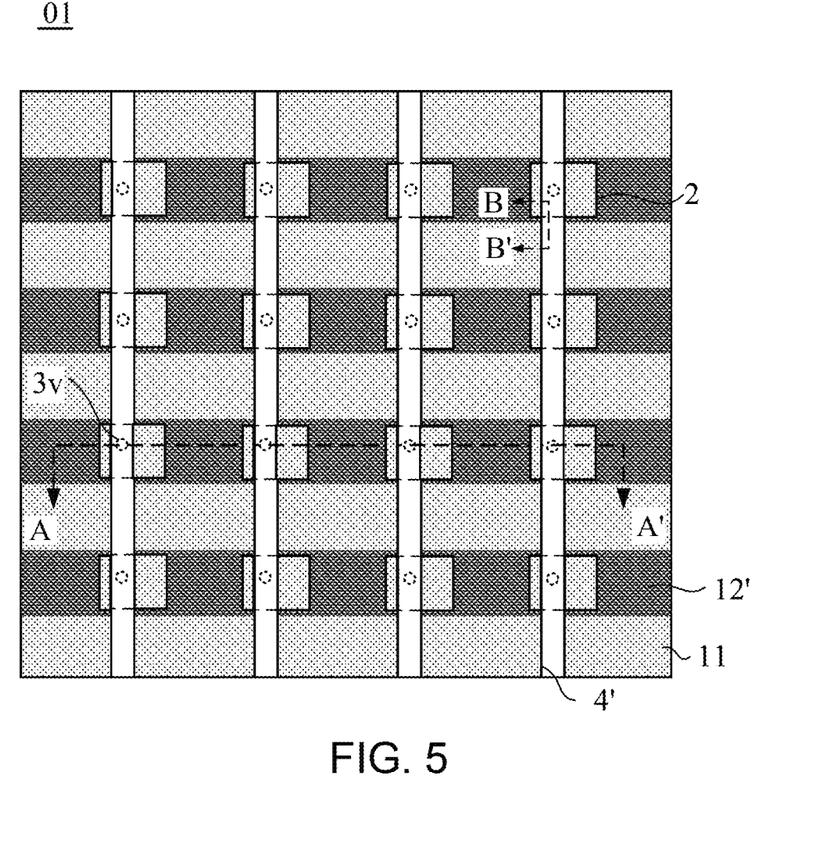
FIG. 5 is a top view of an inorganic light-emitting diode substrate, in accordance with some embodiments of the present disclosure.
Figure 11:
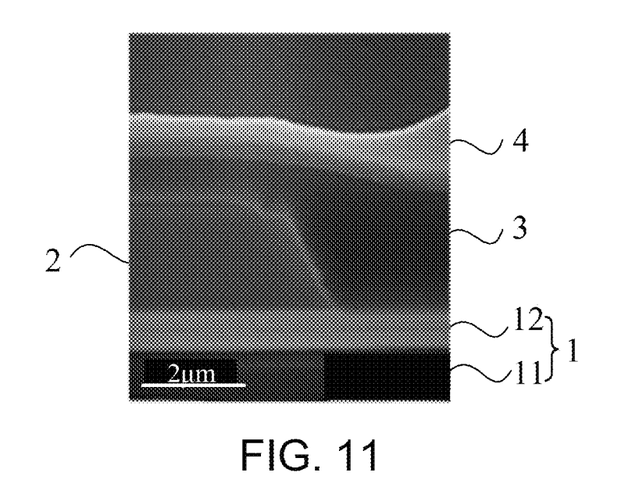
FIG. 11 is a focused ion beam (FIB) micrograph of an inorganic light-emitting diode substrate, in accordance with some embodiments of the disclosure.

FIG. 11 may be regarded as a focused ion beam (FIB) micrograph of a section of the inorganic light-emitting diode substrate 01 taken along the section line BB' in FIG. 5. FIG. 11 shows thicknesses and positions of layers including the first electrode 12, the epitaxial layer structure 2, the passivation layer 3 and the second electrode 4. The section taken along the section line BB' is not a section at a position of a via hole 3v, so that the via hole 3v in the passivation layer 3 cannot be seen in FIG. 11.

In some embodiments, as shown in FIG. 2B, the passivation layer 3 includes first portions 3a and a second portion 3b. The first portions 3a cover surfaces, away from the base substrate 11, of the plurality of epitaxial layer structures 2, and the second portion 3b fills the gaps between the plurality of epitaxial layer structures 2. Relative to the surface of the base substrate 11, surfaces of the first portions 3a away from the base substrate 11 is flush with or substantially flush with a surface of the second portion 3b away from the base substrate 11.

Since the photoresist has the fluidity, the photoresist is able to fill the gap between adjacent epitaxial layer structures 2 during the coating process, so that surfaces of the first portions 3a and the second portion 3b of the formed passivation layer 3 that are away from the base substrate 11 are flush or substantially flush relative to the surface of the base substrate 11. In this way, it is possible to ensure a flatness of the surface of the passivation layer 3, and avoid the problem of the electrical leakage caused by the crack of the passivation layer 3 at the corners of the surface of the epitaxial layer structures 2 away from the base 1.

In some embodiments, for a setting of a thickness of the passivation layer 3, there is a need to consider that the first portions 3a of the passivation layer 3 completely covers the surfaces of the epitaxial layer structures 2, and the second portion 3b fills the gaps between the plurality of epitaxial layer structures 2 so that the surfaces of the first portions 3a and the second portion 3b of the passivation layer 3 that are away from the base substrate 11 are flush or substantially flush relative to the surface of the base substrate 11; furthermore, there is also a need to consider an influence of the thickness of the passivation layer 3 on a difficulty of fabricating the via holes 3v in the passivation layer 3 and the second electrodes 4 located on the passivation layer 3. Therefore, the thickness of the passivation layer 3 needs to be set reasonably.

In some examples, as shown in FIG. 2B, a thickness $d_1$ of the first portions 3a of the passivation layer 3 cannot be too large, so as to avoid an increase in the difficulty of a fabrication process of the via holes 3v and an influence on ohmic contacts between semiconductor layers in the epitaxial layer structures 2 and the second electrodes 4. The thickness $d_1$ of the first portions 3a of the passivation layer 3 cannot be too small to fully play a role of insulation. For example, a ratio of the thickness $d_1$ of the first portions 3a of the passivation layer 3 to a thickness of the epitaxial layer structures 2 is in a range of 1:1 to 3:1. For example, in a case where the thickness of the epitaxial layer structures 2 is 1 μm, the thickness $d_1$ of the first portions 3a may be a range of 1 μm to 3 μm.

As shown in FIG. 2B, the thickness $d_1$ of the first portions 3a of the passivation layer 3 is in a range of 1 μm to 2 μm. For example, the thickness $d_1$ of the first portions 3a of the passivation layer 3 is 2 μm. A thickness $d_2$ of the second portion 3b of the passivation layer 3 is in a range of 2 μm to 4 μm. For example, the thickness $d_2$ of the second portion 3b of the passivation layer 3 is 3 μm. It will be understood that a difference between the thickness $d_2$ of the second portion 3b and the thickness $d_1$ of the first portions 3a is the thickness of the epitaxial layer structures 2.

In order to make the surfaces of the first portions 3a and the second portion 3b of the passivation layer 3 that are away from the base substrate 11 be flush relative to the surface of the base substrate 11, the thickness $d_2$ of the second portion 3b of the passivation layer 3 should be a sum of the thickness $d_1$ of the first portion 3a and the thickness of the epitaxial layer structure 2. In a case where the thickness of the epitaxial layer structure 2 is 1 µm, if the thickness of the first portion 3a of the passivation layer 3 is 2 µm, the thickness of the second portion 3b is 3 µm. In this way, it may be ensured that the surface of the passivation layer 3 is relatively flat, and the thickness of the first portions 3a of the passivation layer 3 is moderate, As a result, it is beneficial to fabricate the via holes 3v and the second electrodes 4; and the passivation layer is not easy to be detached, and thus there is no electrical leakage phenomenon.

In some embodiments, as shown in FIGS. 2B to 4, each epitaxial layer structure 2 includes a first semiconductor layer 21, a light-emitting layer 22, and a second semiconductor layer 23 that are stacked. The light-emitting layer 22 is located between the first semiconductor layer 21 and the second semiconductor layer 23. For example, the light-emitting layer 22 has a quantum well structure.

Figure 3:
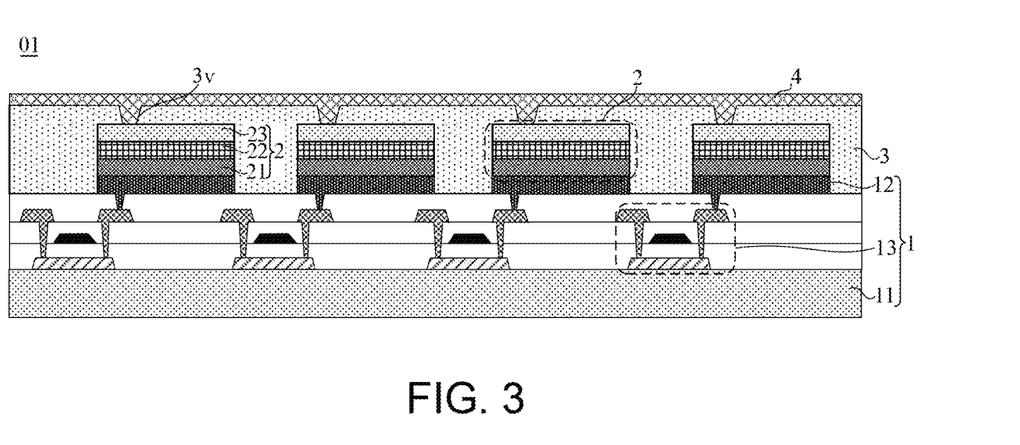
FIG. 3 is a diagram showing a structure of yet another inorganic light-emitting diode substrate, in accordance with some embodiments of the present disclosure.
Figure 4:
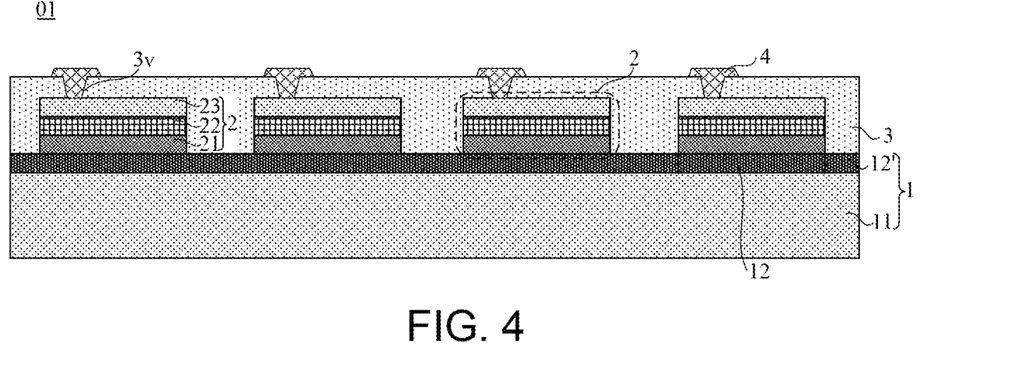
FIG. 4 is a diagram showing a structure of yet another inorganic light-emitting diode substrate, in accordance with some embodiments of the present disclosure.

In the epitaxial layer structure 2, the first semiconductor layer 21 is closer to the base substrate 11 than the light-emitting layer 22 and the second semiconductor layer 23. Each first electrode 12 is coupled to the first semiconductor layer 21 in one epitaxial layer structure 2. Each second electrode 4 is coupled to the second semiconductor layer 23 in the epitaxial layer structure 2 through at least one via hole 3v.

In some examples, the first semiconductor layer 21 is an N-type semiconductor layer. For example, the first semiconductor layer 21 is made of N-type gallium nitride (n-GaN). The second semiconductor layer 23 is a P-type semiconductor layer. For example, the second semiconductor layer 23 is made of P-type gallium nitride (p-GaN). Correspondingly, the first electrode 12 is the cathode, and the second electrode 4 is the anode. The first semiconductor layer 21 of each epitaxial layer structure 2 is coupled to the cathode, and the second semiconductor layer 23 of each epitaxial layer structure 2 is coupled to the anode through the via hole(s) 3v, so that the anode provides a positive voltage to the second semiconductor layer 23, and the cathode provides a negative voltage to the first semiconductor layer 21. Therefore, electrons and holes are transmitted respectively from the first semiconductor layer 21 and the second semiconductor layer 23 to the light-emitting layer 22, and the electrons and the holes are recombined in the light-emitting layer 22 to realize light emission.

In some other examples, the first semiconductor layer 21 is a P-type semiconductor layer. For example, the first semiconductor layer 21 is made of p-GaN. The second semiconductor layer 23 is an N-type semiconductor layer. For example, the second semiconductor layer 23 is made of n-GaN. Correspondingly, the first electrode 12 is the anode, and the second electrode 4 is the cathode. The first semiconductor layer 21 of each epitaxial layer structure 2 is coupled to the anode, and the second semiconductor layer 23 is coupled to the cathode through the via hole(s) 3v, so that the anode provides the positive voltage to the first semiconductor layer 21, and the cathode provides the negative voltage to the second semiconductor layer 23. Therefore, the electrons and the holes are transmitted respectively from the second semiconductor layer 23 and the first semiconductor layer 21 to the light-emitting layer 22, and the electrons and the holes are recombined in the light-emitting layer 22 to realize light emission.

In some embodiments, the passivation layer 3 is made of the epoxy-based photoresist.

Since a refractive index of the epoxy-based photoresist (i.e., SU-8 photoresist) is 1.6, and the refractive index of the silicon dioxide is 1.465, the epoxy-based photoresist has a higher refractive index. Since the passivation layer 3 is made of the epoxy-based photoresist, which is beneficial to improving the light extraction efficiency of the epitaxial layer structure 2.

For example, in a case where the epitaxial layer structure 2 includes the first semiconductor layer 21, the light-emitting layer 22 and the second semiconductor layer 23 that are stacked, the passivation layer 3 covers a surface of the second semiconductor layer 23 away from the base substrate 11, and a contact surface between the passivation layer 3 and the second semiconductor layer 23 is a critical surface of the total reflection. In an example where the second semiconductor layer 23 is made of gallium nitride and dimensions of a single epitaxial layer structure 2 are 10 µm×10 µm×1 µm, since a refractive index of gallium nitride is 2.5, it can be seen that, according the calculation formula of the critical angle θ of the total reflection, i.e., sin θ=n2/n1, the critical angle of the total reflection is calculated to be 35.8° in the case where the passivation layer 3 is made of the silicon dioxide, and the critical angle of the total reflection is calculated to be 39.8° in the case where the passivation layer 3 is made of the epoxy-based photoresist. As a result, the critical angle of the total reflection corresponding to the epoxy-based photoresist is relatively large, which facilitates improvement of the light extraction efficiency of the epitaxial layer structure 2.

Under the above premise, if an absorption of light by the material is not taken into consideration, Monte Carlo ray tracing is used to find that the light extraction efficiency of the single epitaxial layer structure 2 is approximately 84% if the silicon dioxide is used as the material of the passivation layer 3, and the light extraction efficiency of the single epitaxial layer structure 2 is approximately 89% if the epoxy-based photoresist is used as the material of the passivation layer 3. Therefore, the light extraction efficiency of the single epitaxial layer structure 2 in the inorganic light-emitting diode substrate 01 provided in the embodiments of the present disclosure is increased by approximately 5%, which facilitates improvement of a light extraction efficiency of the entire inorganic light-emitting diode substrate 01.

In addition to the above advantages, the epoxy-based photoresist has a low light absorption in a near-ultraviolet band. Therefore, a penetration depth of light in the near-ultraviolet band in the epoxy-based photoresist is large, attenuation of an light intensity at different positions of the photoresist is small, and thus an exposure of the entire photoresist layer is uniform. As a result, the plurality of via holes 3v, which are obtained by performing the exposure and development processes on a photoresist film made of the epoxy-based photoresist, have good uniformity. In addition, the epoxy-based photoresist also has good mechanical property, chemical corrosion resistance and thermal stability, which is beneficial to improving a stability and an impact resistance of the formed inorganic light-emitting diode substrate 01.

In some embodiments, as shown in FIG. 3, the base 1 includes the base substrate 11, driving circuits 13 and the plurality of first electrodes 12. The driving circuits 13 are disposed on the base substrate 11, the plurality of first electrodes 12 are disposed on a side of the driving circuits 13 away from the base substrate 11, and the plurality of first electrodes 12 are coupled to the driving circuits 13. The driving circuits 13 are configured to provide electrical signals to the plurality of first electrodes 12. Therefore, the first electrode 12 and the second electrode 4 may provide voltages to the epitaxial layer structure 2 coupled to the first electrode 12 and the second electrode 4, so as to drive the epitaxial layer structure 2 to emit light.

As shown in FIG. 3, the inorganic light-emitting diode substrate 01 provided in the embodiments of the present disclosure adopts an active driving manner. In some examples, the plurality of first electrodes 12 are arranged in an array, and the plurality of first electrodes 12 are insulated through the passivation layer 3. The first electrode 12 is the anode, and the second electrode 4 is the cathode. Each first electrode 12 is coupled to one driving circuit 13, and the plurality of second electrodes 4 are coupled to each other to form an entire cathode layer.

For example, the driving circuit includes a plurality of thin film transistors (TFTs) and at least one storage capacitor. The driving circuit provides the positive voltage to the first electrode, then the first electrode provides the positive voltage to the epitaxial layer structure 2, and the second electrode provides the negative voltage to the epitaxial layer structure 2 simultaneously, so as to control the epitaxial layer structure 2 to emit light.

In some other embodiments, the inorganic light-emitting diode substrate 01 provided in the embodiments of the present disclosure adopts a passive driving manner. The plurality of first electrodes 12 are arranged in an array, first electrodes 12 in the same row or column are coupled to form a one-piece structure, and second electrodes 4 in the same column or row are coupled to form a one-piece structure.

For example, as shown in FIGS. 4 and 5 (FIG. 4 is a sectional view of the inorganic light-emitting diode substrate 01 in FIG. 5 taken along the section line AA'), the plurality of first electrodes 12 are arranged in an array; the first electrodes 12 in the same row are coupled to form a first electrode strip 12'; and the second electrodes 4 in the same column are coupled to form a second electrode strip 4'. Two adjacent first electrode strips 12' are insulated through the passivation layer 3, and two adjacent second electrode strips 4' are insulated through the passivation layer 3. A region where the first electrode strip 12' and the second electrode strip 4' are overlapped is provided with one epitaxial layer structure 2. In regions where a plurality of first electrode strips 12' and a plurality of second electrode strips 4' are overlapped, the epitaxial layer structures 2 are driven by voltages of the plurality of first electrode strips 12' and the plurality of second electrode strips 4' to emit light. For example, the plurality of first electrode strips 12' are anode strips, and the plurality of second electrode strips 4' are cathode strips.

In some examples, external driving circuit(s) are bonded to the inorganic light-emitting diode substrate 01 by using a chip on glass (COG) manner or tape automated bonding (TAB) manner. The driving circuit(s) are coupled to the plurality of first electrode strips 12' and the plurality of second electrode strips 4'. The driving circuit(s) are configured to provide driving voltages to the plurality of first electrode strips 12' and the plurality of second electrode strips 4', so as to drive the plurality of epitaxial layer structures 2 to emit light.

Figure 6:
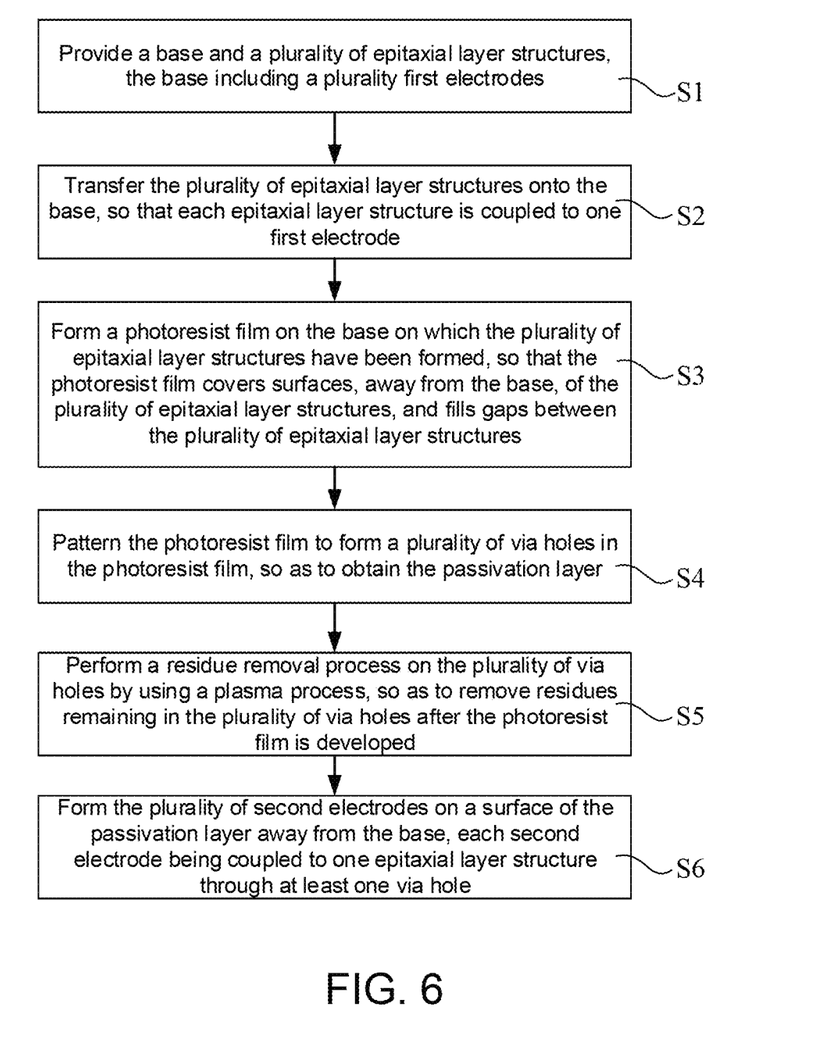
FIG. 6 is a flow diagram of a method of manufacturing an inorganic light-emitting diode substrate, in accordance with some embodiments of the present disclosure.

As shown in FIG. 6, some embodiments of the present disclosure further provide a method of manufacturing an inorganic light-emitting diode substrate 01. The method includes the following steps 1 to 6 (S1 to S6).

In S1, a base 1 and a plurality of epitaxial layer structures 2 are provided, and the base 1 includes a plurality of first electrodes 12.

The base 1 includes a base substrate 11 and the plurality of first electrodes 12 disposed on the base substrate 11. For example, the plurality of first electrodes 12 are arranged in an array.

In some examples, the epitaxial layer structures 2 are formed as follows: sequentially growing a buffer layer, a second semiconductor film, a light-emitting film and a first semiconductor film on a silicon base or a sapphire base; peeling off the silicon base or sapphire base from an interface between the buffer layer and the silicon base or sapphire base; vaporizing the buffer layer by using, for example, a laser lift-off technology, so that a stacked structure composed of the second semiconductor film, the light-emitting film and the first semiconductor film is obtained; dividing the stacked structure to obtain the epitaxial layer structures 2, each epitaxial layer structure 2 including a first semiconductor layer 21, a light-emitting layer 22 and a second semiconductor layer 23 that are stacked.

In S2, the plurality of epitaxial layer structures 2 are transferred onto the base 1, so that each epitaxial layer structure 2 is coupled to one first electrode 12.

In some embodiments, the plurality of epitaxial layer structures 2 may be transferred onto the base 1 by pick-and-place, flip-chip or transfer, so that the first semiconductor layer 21 of each epitaxial layer structure 2 is coupled to the first electrode 12.

Figure 7:
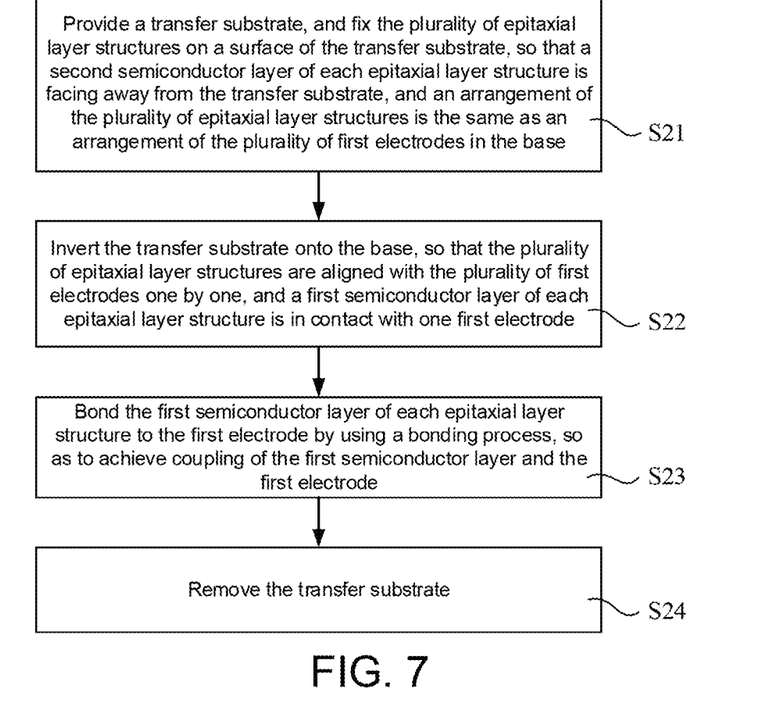
FIG. 7 is a flow diagram of another method of manufacturing an inorganic light-emitting diode substrate, in accordance with some embodiments of the present disclosure.

For example, as shown in FIG. 7, a possible implementation of S2 is provided as follows, including steps 21 to 24 (S21 to S24).

In S21, a transfer substrate is provided, and the plurality of epitaxial layer structures 2 are fixed on a surface of the transfer substrate, so that the second semiconductor layer 23 of each epitaxial layer structure 2 is facing away from the transfer substrate, and an arrangement of the plurality of epitaxial layer structures 2 is the same as an arrangement of the plurality of first electrodes 12 in the base 1.

For example, the plurality of epitaxial layer structures 2 adhere to the surface of the transfer substrate through an adhesive medium such as glue. Adhesion of the adhesive medium may decreases under subsequent laser irradiation, so that the transfer substrate is separated from the plurality of epitaxial layer structures 2.

In S22, the transfer substrate is inverted onto the base 1, so that the plurality of epitaxial layer structures 2 are aligned with the plurality of first electrodes 12 one by one, and the first semiconductor layer 21 of each epitaxial layer structure 2 is in contact with one first electrode 12.

In S23, the first semiconductor layer 21 of each epitaxial layer structure 2 is bonded to the first electrode 12 by using a bonding process, so as to achieve coupling of the first semiconductor layer 21 and the first electrode 12.

In S24, the transfer substrate is removed.

In S3, a photoresist film is formed on the base 1 on which the plurality of epitaxial layer structures 2 have been formed, so that the photoresist film covers surfaces, away from the base 1, of the plurality of epitaxial layer structures 2, and fills gaps between the plurality of epitaxial layer structures 2.

Figure 8:
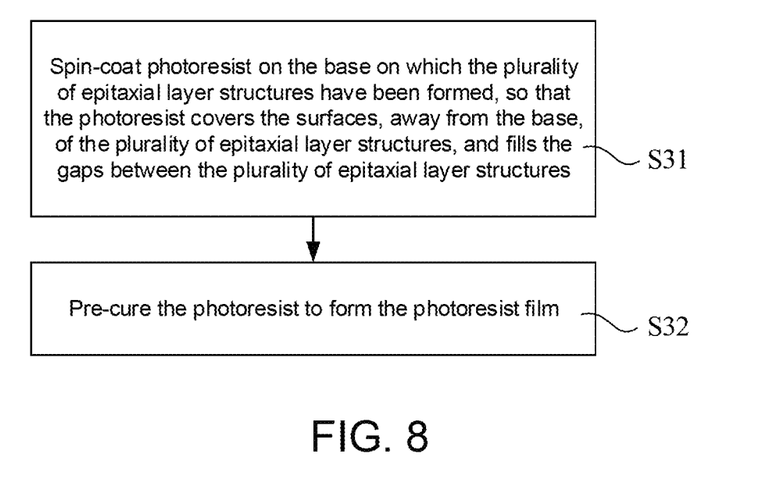
FIG. 8 is a flow diagram of yet another method of manufacturing an inorganic light-emitting diode substrate, in accordance with some embodiments of the present disclosure.

In some embodiments, as shown in FIG. 8, S3 includes steps 31 and 32 (S31 and S32).

In S31, photoresist is spin-coated on the base 1 on which the plurality of epitaxial layer structures 2 have been formed, so that the photoresist covers the surfaces, away from the base 1, of the plurality of epitaxial layer structures 2, and fills the gaps between the plurality of epitaxial layer structures 2.

For example, the photoresist is epoxy-based photoresist. A spin coating speed is controlled according to a preset thickness of the passivation layer 3. Therefore, the photoresist may cover the surfaces, away from the base 1, of the plurality of epitaxial layer structures 2, and fill the gaps between the plurality of epitaxial layer structures 2. A thickness of portions, on the plurality of epitaxial layer structures 2, of the photoresist is 1 μm; and in a case where the thickness of the epitaxial layer structure 2 is 2 μm, a thickness of a portion of the photoresist located in the gaps is 3 μm.

In S32, the photoresist is pre-cured to form the photoresist film.

The substrate on which the photoresist has been formed is placed on a high-temperature heating stage for several minutes to pre-cure the photoresist, so that the photoresist film is formed.

In S4, the photoresist film is patterned to form a plurality of via holes 3v in the photoresist film, so that the passivation layer 3 is obtained.

Figure 9:
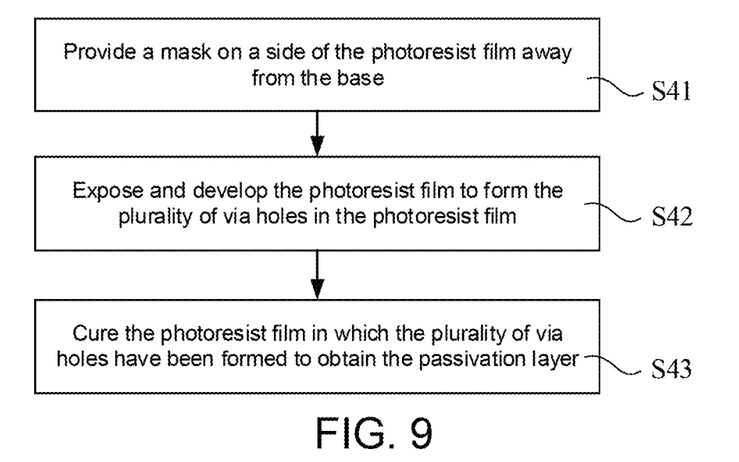
FIG. 9 is a flow diagram of yet another method of manufacturing an inorganic light-emitting diode substrate, in accordance with some embodiments of the present disclosure.

In some embodiments, as shown in FIG. 9, S4 includes steps 41 to 43 (S41 to S43).

Figure 12:
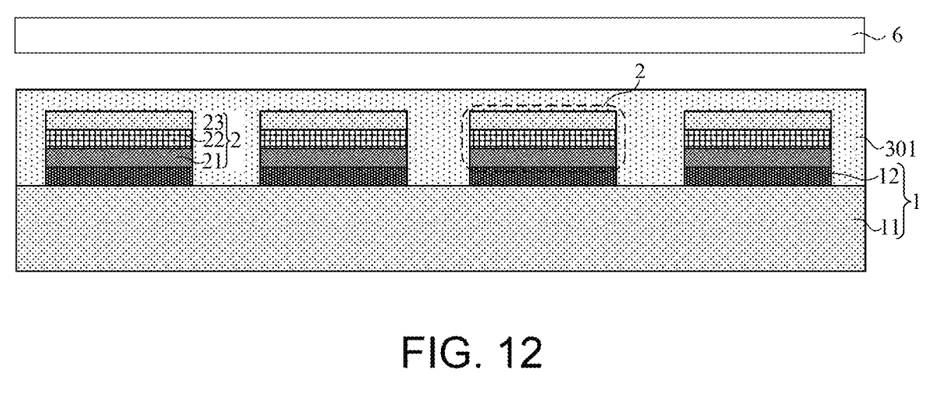
FIG. 12 is a diagram showing a process of forming a passivation layer, in accordance with some embodiments of the present disclosure.

In S41, referring to FIG. 12, a mask 6 is provided on a side of the photoresist film 301 away from the base 1.

In S42, the photoresist film 301 is exposed and developed to form the plurality of via holes 3v in the photoresist film 301.

For example, the photoresist film is exposed due to a shielding effect of the mask. In a case where the photoresist is the epoxy-based photoresist, the epoxy-based photoresist is a negative photoresist. Thus, a pattern of the mask is opposite to a pattern of the passivation layer 3 to be formed, and the photoresist film except portions corresponding to the via holes 3v is exposed. After the exposure is completed, the photoresist film is developed using a developing solution, so that the portions of the photoresist film corresponding to the via holes 3v are dissolved in the developing solution, and then the via holes 3v are formed in the photoresist film.

In S43, the photoresist film in which the plurality of via holes 3v have been formed is cured to obtain the passivation layer 3.

The substrate on which the plurality of via holes 3v have been formed is placed on the high-temperature heating stage to cure the photoresist, so as to obtain the passivation layer 3.

In S5, a residue removal processing is performed on the plurality of via holes 3v by using a plasma process, so as to remove residues remaining in the plurality of via holes 3v after the photoresist film is developed.

For example, an oxygen plasma treatment process is used to process the plurality of via holes 3v for a short time, so as to remove the residues in the plurality of via holes 3v after the photoresist film is developed. In this way, when a plurality of second electrodes 4 are subsequently fabricated, the second electrode 4 may be in direct contact with the second semiconductor layer 23 in the epitaxial layer structure 2, so that an ohmic contact between the second electrode 4 and the second semiconductor layer 23 is good, which facilitates transmission of carriers.

In S6, the plurality of second electrodes 4 are formed on a surface of the passivation layer 3 away from the base 1, and each second electrode 4 is coupled to one epitaxial layer structure 2 through at least one via hole 3v.

For example, the plurality of second electrodes 4 are formed on the surface of the passivation layer 3 away from the base 1 using an electrochemical deposition process or an evaporation process, so that each second electrode 4 is coupled to the second semiconductor layer 23 of the epitaxial layer structure 2 through the at least one via hole 3v.

In the method of manufacturing the inorganic light-emitting diode substrate 01 provided in the embodiments of the present disclosure, the photoresist is used for forming the passivation layer 3. Due to the fluidity of the photoresist, the photoresist may fill the gap between adjacent epitaxial layer structures 2 during the coating process in a fabrication process of the passivation layer 3. Therefore, the formed passivation layer 3 may cover the surfaces, away from the base 1, of the plurality of epitaxial layer structures 2, and fill the gaps between the plurality of epitaxial layer structures 2; and a surface, away from the base 1, of the passivation layer 3 is relatively flat. In this way, it may avoid the problem that the passivation layer 3 is prone to crack at the corners of the surfaces of the epitaxial layer structures 2 away from the base 1, and eliminate the electrical leakage caused by the crack of the passivation layer 3. In addition, since the photoresist is an organic material, and adhesive force of the photoresist is better than adhesive force of the inorganic material such as silicon dioxide, there is no detaching problem of the passivation layer 3.

The exposure and development processes are used to form the plurality of via holes 3v in the photoresist film, so as to obtain the passivation layer 3. Therefore, the use of deposition and etching processes with high difficulties in the related art is avoided, and then the use of high-cost deposition and etching equipments is avoided. As a result, the fabrication process is simplified, and the production cost is saved.

In the obtained inorganic light-emitting diode substrate 01, the passivation layer 3 is made of the photoresist. Compared with the passivation layer 3 made of the silicon dioxide, more of light emitted by the epitaxial layer structures 2 may pass through the passivation layer 3, which is beneficial to improving the light extraction efficiency of the epitaxial layer structures 2, and is further beneficial to improving the luminous efficiency of the inorganic light-emitting diode substrate 01.

Figure 10:
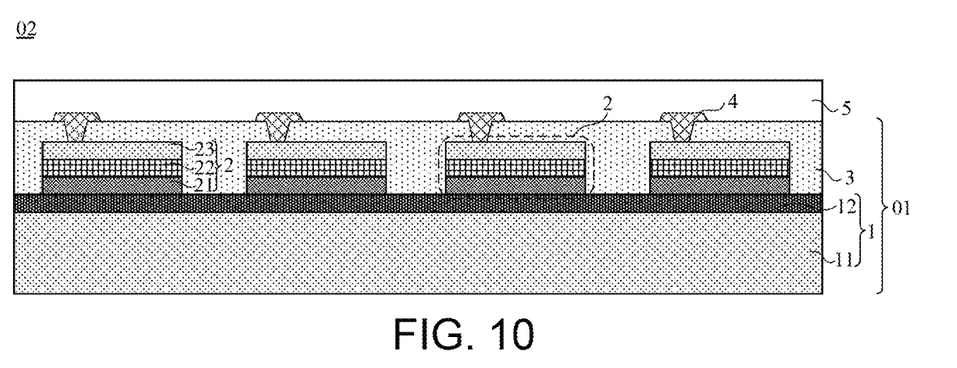
FIG. 10 is a diagram showing a structure of an inorganic light-emitting diode display device, in accordance with some embodiments of the present disclosure.

As shown in FIG. 10, some embodiments of the present disclosure further provide an inorganic light-emitting diode display device 02. The inorganic light-emitting diode display device 02 includes the inorganic light-emitting diode substrate 01 and an encapsulation substrate 5. The encapsulation substrate 5 is disposed on a side of the inorganic light-emitting diode substrate 01 where the second electrodes 4 are disposed.

In some examples, the inorganic light-emitting diode display device 02 is a micro light-emitting diode (micro LED) display device or a mini light-emitting diode (mini LED) display device.

The inorganic light-emitting diode display device 02 provided in the embodiments of the present disclosure has the advantages of high resolution, low power consumption, high brightness, high definition, high color saturation, fast response speed, long service life, etc., and also has the same technical effects as the inorganic light-emitting diode substrate 01, such as high light extraction efficiency, and great reduction in a probability of the electrical leakage; and details will not be repeated here.

The inorganic light-emitting diode display device provided in some embodiments of the present disclosure may be any device that displays images whether in motion (e.g., videos) or stationary (e.g., static images), and whether literal or graphical. More specifically, it is anticipated that the described embodiments may be implemented in or associated with a variety of electronic devices. The variety of electronic devices may include (but are not limited to), for example, mobile phones, wireless devices, personal data assistants (PDAs), hand-held or portable computers, global positioning system (GPS) receivers/navigators, cameras, MPEG-4 Part 14 (MP4) video players, video cameras, game consoles, watches, clocks, calculators, TV monitors, flat-panel displays, computer monitors, automobile displays (e.g., odometer displays), navigators, cockpit controllers and/or displays, camera view displays (e.g., displays of rear-view cameras in vehicles), electronic photos, electronic billboards or signages, projectors, building structures, packaging structures and aesthetic structures (e.g., a display for an image of a piece of jewelry).

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. An inorganic light-emitting diode substrate, comprising:
    a base including a base substrate and a plurality of first electrodes disposed on the base substrate;
    a plurality of epitaxial layer structures disposed on the base, the plurality of epitaxial layer structures being spaced apart, and each first electrode being coupled to one epitaxial layer structure;
    a passivation layer, the passivation layer being made of photoresist, the passivation layer covering surfaces, away from the base, of the plurality of epitaxial layer structures, and filling gaps between the plurality of epitaxial layer structures, and the passivation layer having a plurality of via holes; and
    a plurality of second electrodes disposed on a side of the passivation layer away from the base, each second electrode being coupled to one epitaxial layer structure through at least one via hole;
    wherein the plurality of first electrodes are arranged in an array, and first electrodes in a same row are coupled to each other to form a first electrode strip;
    the plurality of second electrodes are arranged in an array, and second electrodes in a same column are coupled to each other to form a second electrode strip; and
    the plurality of epitaxial layer structures are arranged in an array, and a region where the first electrode strip and the second electrode strip are overlapped is provided with one epitaxial layer structure.

2. The inorganic light-emitting diode substrate according to claim 1, wherein the passivation layer includes first portions and a second portion, the first portions cover surfaces, away from the base, of the plurality of epitaxial layer structures, and the second portion fills the gaps between the plurality of epitaxial layer structures; and
    relative to a surface, on which the plurality of first electrodes are disposed, of the base substrate, surfaces of the first portions away from the base are flush with a surface of the second portion away from the base.

3. The inorganic light-emitting diode substrate according to claim 2, wherein a ratio of a thickness of the first portions of the passivation layer to a thickness of the epitaxial layer structures is in a range of 1:1 to 3:1.

4. The inorganic light-emitting diode substrate according to claim 1, wherein the passivation layer is made of epoxy-based photoresist.

5. The inorganic light-emitting diode substrate according to claim 1, wherein each epitaxial layer structure includes a first semiconductor layer, a light-emitting layer, and a second semiconductor layer that are stacked, the light-emitting layer being located between the first semiconductor layer and the second semiconductor layer, wherein in the epitaxial layer structure, the first semiconductor layer is closer to the base than the light-emitting layer and the second semiconductor layer;
    each first electrode is coupled to the first semiconductor layer in one epitaxial layer structure; and
    each second electrode is coupled to the second semiconductor layer in one epitaxial layer structure through at least one via hole.

6. The inorganic light-emitting diode substrate according to claim 1, wherein the base includes:
    the base substrate;
    driving circuits disposed on the base substrate; and
    the plurality of first electrodes disposed on a side of the driving circuits away from the base substrate, and the first electrode being coupled to one driving circuit.

7. An inorganic light-emitting diode display device, comprising: the inorganic light-emitting diode substrate according to claim 1; and
    an encapsulation substrate disposed on a side of the inorganic light-emitting diode substrate.

8. The inorganic light-emitting diode substrate according to claim 3, wherein the thickness of the first portions is in a range of 1 μm to 3 μm.

9. The inorganic light-emitting diode substrate according to claim 3, wherein a thickness of the second portion is in a range of 2 μm to 4 μm.

10. The inorganic light-emitting diode substrate according to claim 5, wherein the first semiconductor layer is made of N-type gallium nitride, and the second semiconductor layer is made of P-type gallium nitride.

11. The inorganic light-emitting diode substrate according to claim 5, wherein the first semiconductor layer is made of P-type gallium nitride, and the second semiconductor layer is made of N-type gallium nitride.

12. The inorganic light-emitting diode substrate according to claim 1, wherein the plurality of second electrodes are coupled to each other to form a cathode layer.

13. A manufacturing method of an inorganic light-emitting diode substrate, comprising:
    providing a base and a plurality of epitaxial layer structures, the base including a plurality of first electrodes;
    transferring the plurality of epitaxial layer structures onto the base, so that each epitaxial layer structure is coupled to one first electrode;
    forming a photoresist film on the base on which the plurality of epitaxial layer structures have been formed, so that the photoresist film covers surfaces, away from the base, of the plurality of epitaxial layer structures, and fills gaps between the plurality of epitaxial layer structures;
    patterning the photoresist film to form a plurality of via holes in the photoresist film, so as to obtain a passivation layer, and
    forming a plurality of second electrodes on a surface of the passivation layer away from the base, and each second electrode being coupled to one epitaxial layer structure through at least one via hole;
    wherein the plurality of first electrodes are arranged in an array, and first electrodes in a same row are coupled to each other to form a first electrode strip;

the plurality of second electrodes are arranged in an array, and second electrodes in a same column are coupled to each other to form a second electrode strip; and the plurality of epitaxial layer structures are arranged in an array, and a region where the first electrode strip and the second electrode strip are overlapped is provided with one epitaxial layer structure.

14. The manufacturing method according to claim 13, wherein patterning the photoresist film to form the plurality of via holes in the photoresist film, so as to obtain the passivation layer includes:

providing a mask on a side of the photoresist film away from the base;

performing exposure and development processes on the photoresist film to form the plurality of via holes in the photoresist film; and curing the photoresist film in which the plurality of via holes have been formed to obtain the passivation layer.

15. The manufacturing method according to claim 13, wherein forming the photoresist film on the base on which the plurality of epitaxial layer structures have been formed includes:

spin-coating photoresist on the base on which the plurality of epitaxial layer structures have been formed, so that the photoresist covers the surfaces, away from the base, of the plurality of epitaxial layer structures, and fills the gaps between the plurality of epitaxial layer structures; and pre-curing the photoresist to form the photoresist film.

16. The manufacturing method according to claim 13, wherein before forming the plurality of second electrodes on the surface of the passivation layer away from the base, the manufacturing method further comprises:

performing a residue removal processing on the plurality of via holes by using a plasma process, so as to remove residues remaining in the plurality of via holes after the photoresist film is developed.

17. The manufacturing method according to claim 14, wherein forming the photoresist film on the base on which the plurality of epitaxial layer structures have been formed includes:

spin-coating photoresist on the base on which the plurality of epitaxial layer structures have been formed, so that the photoresist covers the surfaces, away from the base, of the plurality of epitaxial layer structures, and fills the gaps between the plurality of epitaxial layer structures; and pre-curing the photoresist to form the photoresist film.

* * * * *